(12) United States Patent
Ichimura et al.

(10) Patent No.: US 12,451,375 B2
(45) Date of Patent: Oct. 21, 2025

(54) SUBSTRATE PROCESSING APPARATUS, METHOD OF MANUFACTURING SEMICONDUCTOR DEVICE AND METHOD OF PROCESSING SUBSTRATE SUPPORT

(71) Applicant: Kokusai Electric Corporation, Tokyo (JP)

(72) Inventors: Keita Ichimura, Toyama (JP); Yukinori Aburatani, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 841 days.

(21) Appl. No.: 17/477,079

(22) Filed: Sep. 16, 2021

(65) Prior Publication Data

US 2022/0005712 A1 Jan. 6, 2022

Related U.S. Application Data

(63) Continuation of application No. PCT/JP2020/011443, filed on Mar. 16, 2020.

(30) Foreign Application Priority Data

Mar. 22, 2019 (JP) ................................. 2019-055551

(51) Int. Cl.
*H01L 21/67* (2006.01)
*H01L 21/02* (2006.01)
*H01L 21/687* (2006.01)

(52) U.S. Cl.
CPC .. *H01L 21/67103* (2013.01); *H01L 21/02269* (2013.01); *H01L 21/6719* (2013.01); *H01L 21/68757* (2013.01)

(58) Field of Classification Search
CPC ......... H01L 21/67103; H01L 21/02269; H01L 21/6719
See application file for complete search history.

(56) References Cited

U.S. PATENT DOCUMENTS 3,994,717 A * 11/1976 Avery ....................... C22B 5/06
75/10.33
10,192,735 B2 * 1/2019 Ueda ................. H01L 21/02238
(Continued)

FOREIGN PATENT DOCUMENTS

CN 100402895 C * 7/2008 ............. F16J 15/128
CN 101508191 A * 8/2009
(Continued)

OTHER PUBLICATIONS

Notice of Reasons for Refusal with English translation in corresponding Japanese Application No. 2021-509089, issued Jul. 11, 2021, 9 pages.

*Primary Examiner* — Laura M Menz
(74) *Attorney, Agent, or Firm* — Edell, Shapiro & Finnan, LLC

(57) ABSTRACT

Described herein is a technique capable of preventing a constituent contained in an aluminum alloy from being vaporized and scattered when the aluminum alloy is used in a process vessel which is heated to a high temperature. According to one aspect thereof, there is provided a technique including a process chamber; a substrate support configured to support a substrate in the process chamber; and a heater configured to heat the substrate supported by the substrate support, wherein the substrate support is made of an aluminum alloy containing magnesium, and a surface of the substrate support is coated by a coating film of aluminum oxide containing magnesium oxide and being substantially free of magnesium.

17 Claims, 4 Drawing Sheets

(56) References Cited

U.S. PATENT DOCUMENTS

| | | | |
|---|---|---|---|
| 11,574,815 B1 * | 2/2023 | Amano | C23C 16/4404 |
| 11,685,993 B2 * | 6/2023 | Morita | B08B 9/032 |
| | | | 438/791 |
| 2006/0228571 A1 * | 10/2006 | Ohmi | C23C 8/36 |
| | | | 148/241 |
| 2010/0143707 A1 * | 6/2010 | Sasaoka | C23C 14/025 |
| | | | 204/192.15 |
| 2012/0329290 A1 | 12/2012 | Shimada et al. | |
| 2013/0108812 A1 * | 5/2013 | Zhu | C04B 35/19 |
| | | | 156/89.12 |
| 2018/0117080 A1 * | 5/2018 | Shani | A61K 33/06 |
| 2019/0206679 A1 * | 7/2019 | Maeda | H01L 21/02513 |
| 2021/0230745 A1 * | 7/2021 | Morita | B08B 9/0821 |
| 2022/0005712 A1 * | 1/2022 | Ichimura | H01L 21/67103 |
| 2023/0060301 A1 * | 3/2023 | Amano | C23C 16/45572 |
| 2023/0089509 A1 * | 3/2023 | Morita | H01L 21/67115 |
| | | | 219/385 |

FOREIGN PATENT DOCUMENTS

| | | | | |
|---|---|---|---|---|
| CN | 201371612 Y | * | 12/2009 | |
| CN | 101508191 B | * | 6/2012 | |
| CN | 102560349 A | * | 7/2012 | C23C 14/081 |
| CN | 115716754 A | * | 2/2023 | |
| CN | 113145578 B | * | 9/2023 | B08B 9/032 |
| CN | 117969582 A | * | 5/2024 | G01N 31/12 |
| JP | 10223620 A | | 8/1998 | |
| JP | 2006-286434 A | | 10/2006 | |
| JP | 3902408 B2 | * | 4/2007 | C23C 16/452 |
| JP | 2008153273 A | * | 7/2008 | |
| JP | 2010114280 A | | 5/2010 | |
| JP | 2010214628 A | | 9/2010 | |
| JP | 2013-008949 A | | 1/2013 | |
| JP | WO2020196025 A1 | * | 12/2021 | H01L 21/68757 |
| JP | 7394115 B2 | * | 12/2023 | H01L 21/68757 |
| TW | I794488 B | * | 3/2023 | C25D 11/18 |
| WO | WO-2006135043 A1 | * | 12/2006 | C25D 11/16 |
| WO | WO-2007055955 A2 | * | 5/2007 | C23C 18/1216 |
| WO | WO-2010053687 A2 | * | 5/2010 | H01J 37/32477 |
| WO | WO-2016166599 A1 | * | 10/2016 | A61K 33/24 |
| WO | WO-2020196025 A1 | * | 10/2020 | H01L 21/68757 |

\* cited by examiner

SUBSTRATE PROCESSING APPARATUS, METHOD OF MANUFACTURING SEMICONDUCTOR DEVICE AND METHOD OF PROCESSING SUBSTRATE SUPPORT

CROSS REFERENCE TO RELATED APPLICATIONS

This application is a continuation of International Application No. PCT/JP2020/011443, filed on Mar. 18, 2020, which claims priority under 35 U.S.C. § 119 to Application No. JP 2019-055551 filed on Mar. 22, 2019, the entire contents of which are hereby incorporated by reference.

TECHNICAL FIELD

The present disclosure relates to a substrate processing apparatus, a method of manufacturing a semiconductor device and method of processing a substrate support.

BACKGROUND

As a part of manufacturing processes of a semiconductor device, for example, a substrate processing of supplying a gas onto a substrate heated to a desired temperature to perform various processes such as a film-forming process of forming a film on the substrate and an ashing process may be performed. In a process vessel of a substrate processing apparatus, a structure made of an aluminum (Al) alloy may be used.

However, when the aluminum alloy is used in the process vessel which is heated to a high temperature, a constituent contained in the aluminum alloy may be vaporized and scattered in the process vessel. As a result, an inner portion of the process vessel and the substrate to be processed may be contaminated. When the inner portion of the process vessel or the substrate to be processed is contaminated, the substrate processing apparatus cannot perform a normal processing, or the substrate to be processed may be subject to lot rejection (which is commonly referred to as "lot-out").

SUMMARY

Described herein is a technique capable of preventing a constituent contained in an aluminum alloy from being vaporized and scattered when the aluminum alloy is used in a process vessel which is heated to a high temperature.

According to one aspect of the technique of the present disclosure, there is provided a technique including: a process chamber in which a substrate is processed; a substrate support configured to support the substrate in the process chamber; and a heater configured to heat the substrate supported by the substrate support, wherein the substrate support is made of an aluminum alloy containing magnesium, and a surface of the substrate support is coated by a coating film of aluminum oxide containing magnesium oxide and being substantially free of magnesium.

DETAILED DESCRIPTION

Embodiments

Hereinafter, one or more embodiments (also simply referred to as "embodiments") according to the technique of the present disclosure will be described with reference to the drawings.

(1) Configuration of Substrate Processing Apparatus

Figure 1:
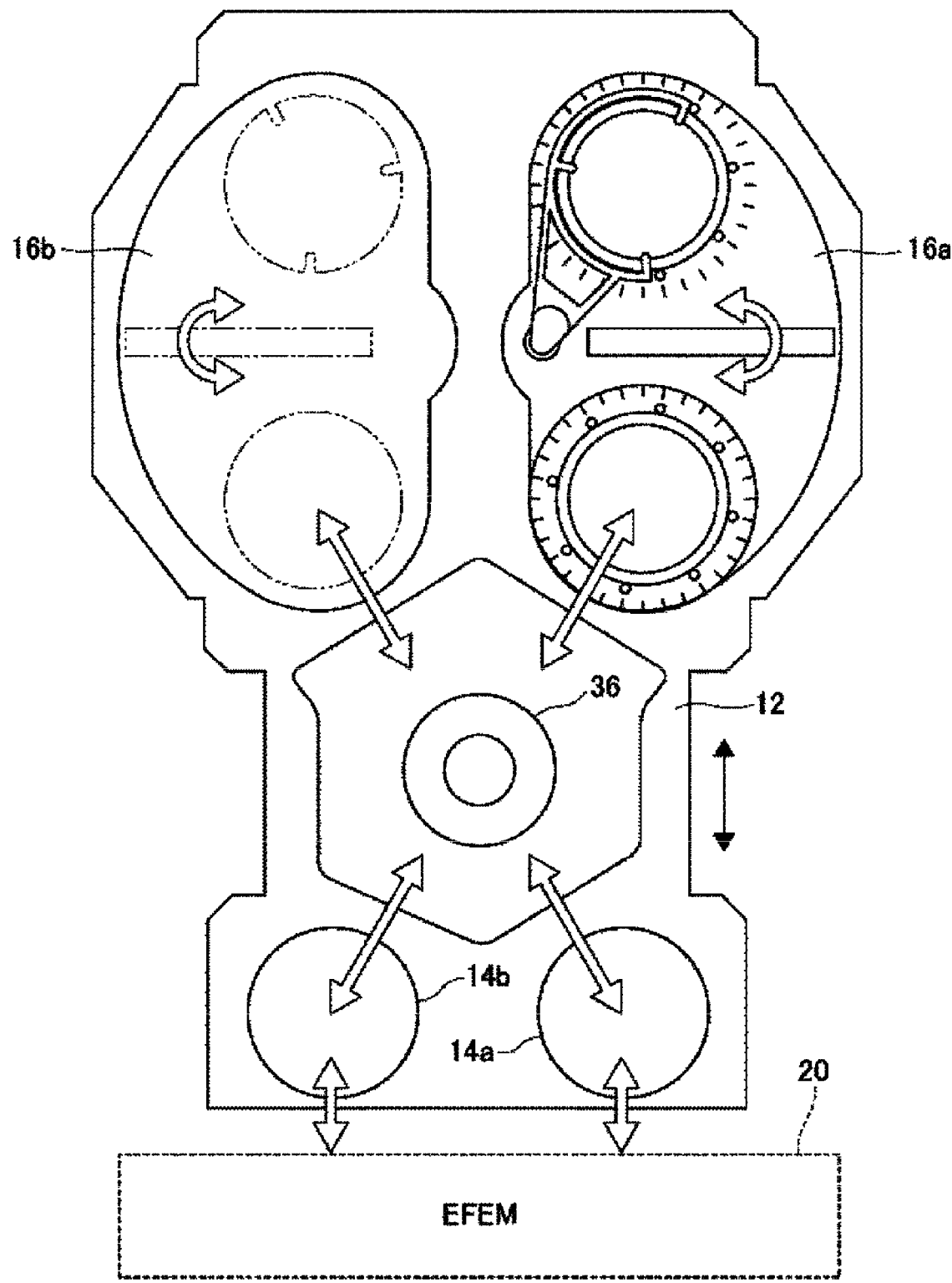
FIG. 1 is a diagram schematically illustrating a horizontal cross-section of a substrate processing apparatus according to one or more embodiments described herein.

As shown in FIG. 1, in a substrate processing apparatus 10 according to the present embodiments, for example, two load lock chambers 14a and 14b and two process chambers 16a and 16b are provided around a transfer chamber 12, and an atmospheric transfer chamber (also referred to as an "equipment front end module" or an "EFEM") 20 through which a substrate is transferred between a carrier (not shown) such as a cassette and the load lock chambers 14a and 14b is provided on upstream sides of the load lock chambers 14a and 14b. At the atmospheric transfer chamber 20, three FOUPs (Front Opening Unified Pods) (not shown) capable of accommodating a plurality of substrates (for example, 25 substrates) at regular intervals in a vertical direction are provided. In addition, an atmospheric robot (not shown), which is configured to simultaneously transfer a plurality of substrates (for example, 5 substrates) between the atmospheric transfer chamber 20 and the load lock chambers 14a and 14b, is disposed in the atmospheric transfer chamber 20. For example, the transfer chamber 12, the load lock chambers 14a and 14b and the process chambers 16a and 16b are made of aluminum (Al).

First, configurations of the load lock chambers 14a and 14b will be described. The configuration of the load lock chamber 14a and the configuration of the load lock chamber 14b are the same except that they are symmetrical. Thus, the description of the load lock chamber 14b will be omitted.

Figure 2:
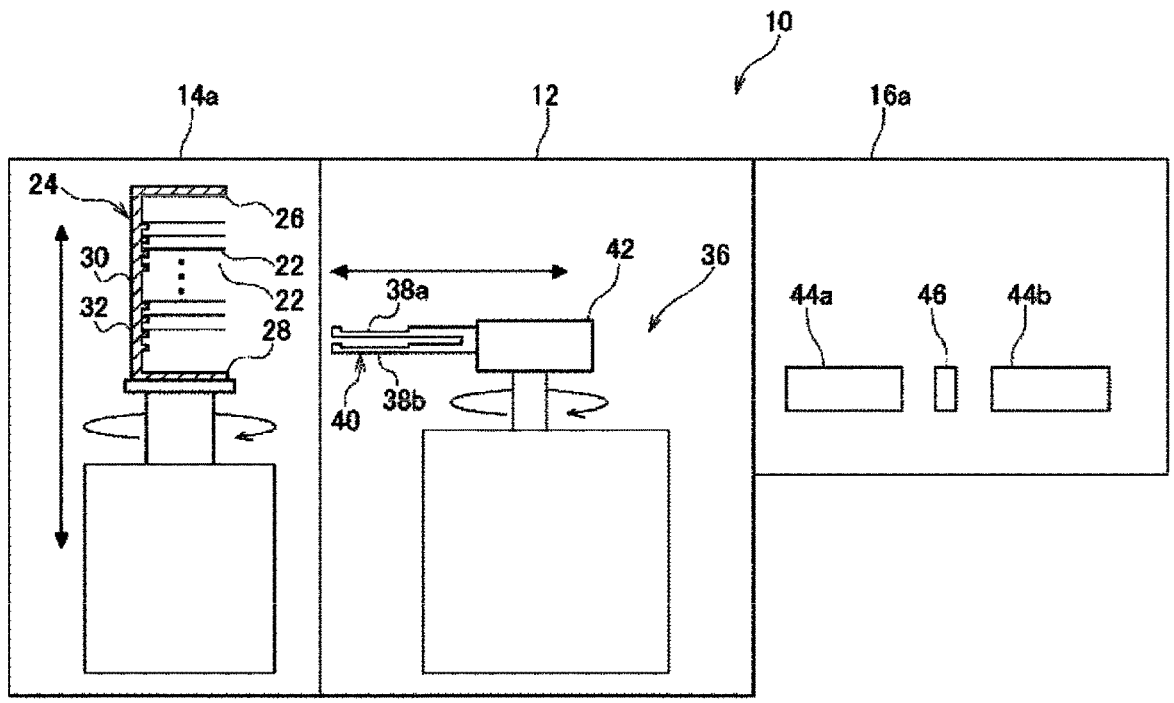
FIG. 2 is a diagram schematically illustrating a vertical cross-section of the substrate processing apparatus according to the embodiments described herein.

As shown in FIG. 2, the load lock chamber 14a is provided with a substrate retainer (boat) 24 in which a plurality of substrates (for example, 25 wafers) including a substrate 22 at regular intervals in the vertical direction. Hereinafter, the plurality of substrates including the substrate 22 may also be simply referred to as substrates 22. For example, the substrate retainer 24 is made of a material such as silicon carbide. A plurality of mounting plates (for example, 25 mounting plates) 32 configured to support the substrates 22 are provided at inner sides of a plurality of support columns (for example, three support columns) 30 of the substrate retainer 24 in a parallel manner along a longitudinal direction. Hereinafter, the plurality of mounting plates 32 may also be simply referred to as mounting plates 32. Further, the substrate retainer 24 is configured to rotate about a vertically extending rotation axis while moving in the vertical direction (that is, moving upward or downward)

in the load lock chamber 14a. As the substrate retainer 24 moves in the vertical direction, two substrates among the substrates 22 are simultaneously transferred from a finger pair 40 to be described later to upper surfaces of the mounting plates 32 installed at each of the three support columns 30 in the substrate retainer 24. Similarly, as the substrate retainer 24 moves in the vertical direction, two substrates among the substrates 22 are simultaneously transferred from the substrate retainer 24 to the finger pair 40.

A vacuum robot 36 configured to transfer the substrates 22 between the load lock chamber 14a and the process chamber 16a is installed in the transfer chamber 12. The vacuum robot 36 includes an arm 42 provided with the finger pair 40 including an upper finger 38a and a lower finger 38b. For example, a shape of the upper finger 38a and a shape of the lower finger 38b are the same. The upper finger 38a and the lower finger 38b are separated in the vertical direction with a predetermined interval therebetween. The upper and the lower finger 38a and 38b extend from the arm 42 in a substantially same horizontal direction so as to simultaneously support two substrates among the substrates 22, respectively. The arm 42 is configured to rotate about a vertically extending rotation axis and to move in a horizontal direction. The arm 42 is capable of simultaneously transferring two substrates among the substrates 22.

(2) Configuration of Process Chamber

Figure 3:
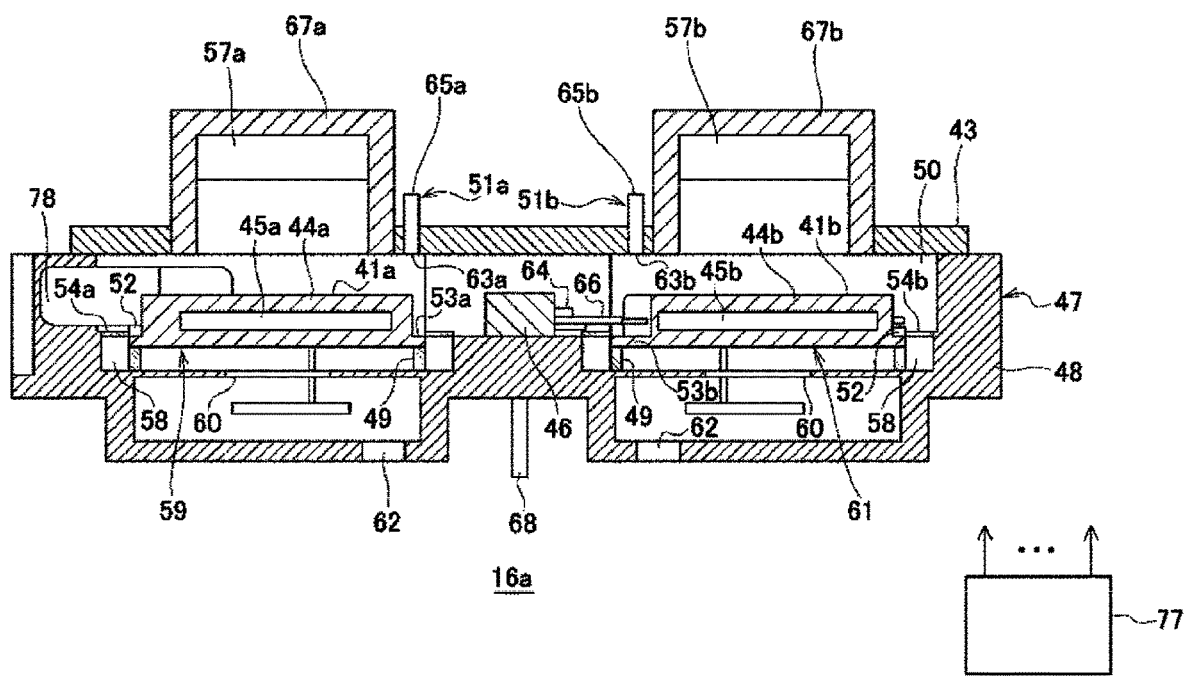
FIG. 3 is a diagram schematically illustrating a vertical cross-section of a process chamber of the substrate processing apparatus according to the embodiments described herein.

Subsequently, configurations of the process chambers 16a and 16b will be described mainly with reference to FIG. 3. FIG. 3 is a diagram schematically illustrating a vertical cross-section of the process chamber 16a of the substrate processing apparatus 10 according to the present embodiments. The configuration of the process chamber 16a and the configuration of the process chamber 16b are the same except that they are symmetrical. Thus, the description of the process chamber 16b will be omitted.

As shown in FIG. 3, the process chamber 16a communicates with the transfer chamber 12 through a gate valve 78. The process chamber 16a includes a process vessel 47. The process vessel 47 includes a lid 43 of a cap shape and a lower vessel 48. The process vessel 47 is configured by the lid 43 being airtightly provided on the lower vessel 48. For example, the lid 43 is made of a non-metallic material such as aluminum oxide (AlO) or quartz, and the lower vessel 48 is made of a material such as aluminum (Al). A reaction chamber 50 in which the substrate 22 is accommodated is provided in the process vessel 47.

For example, two substrate mounting tables 44a and 44b, which are substrate supports, are disposed in the reaction chamber 50. That is, the substrate mounting tables 44a and 44b are provided in the same space of the reaction chamber 50. Substrate placing surfaces 41a and 41b on which the substrate 22 may be placed are provided on upper surfaces of the substrate mounting tables 44a and 44b (that is, surfaces of the substrate mounting tables 44a and 44b facing the lid 43), respectively. The substrate mounting table (also referred to as a "second substrate mounting table") 44b is arranged away from the transfer chamber 12 with the substrate mounting table (also referred to as a "first substrate mounting table") 44a disposed in between. The reaction chamber 50 is constituted by a first processing structure 59 including the first substrate mounting table 44a and a second processing structure 61 including the second substrate mounting table 44b. A space between the first processing structure 59 and the second processing structure 61 is partially and horizontally partitioned by a partition structure 46. The first processing structure 59 and the second processing structure 61 are independently provided. The first processing structure 59 and the second processing structure 61 communicate with each other.

The process chamber 16a is configured such that, by placing two substrates among the substrates 22 on the substrate mounting tables 44a and 44b, respectively, through the vacuum robot 36, a heat treatment process can be simultaneously performed on the two substrates among the substrates 22 in the same space of the reaction chamber 50.

Substrate Support

Figure 4:
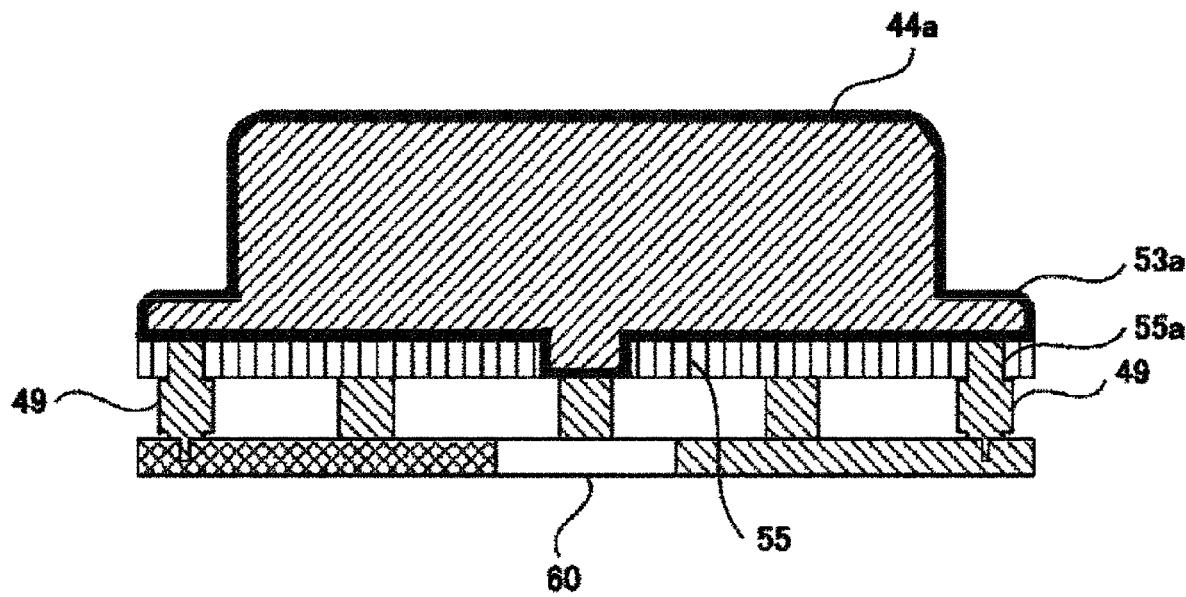
FIG. 4 is an enlarged view schematically illustrating a substrate mounting table of the substrate processing apparatus according to the embodiments described herein.

FIG. 4 is a diagram schematically illustrating a vertical cross-section of the substrate mounting table 44a serving as the substrate support according to the present embodiments. As described above, in a lower portion of the reaction chamber 50, the two substrate mounting tables 44a and 44b serving as the substrate supports configured to support (or hold) two substrates among the substrates 22 on the substrate placing surfaces 41a and 41b, respectively, are arranged. Each of the first substrate mounting table 44a and the second substrate mounting table 44b is fixed to the process vessel 47 by a fixing structure 52 in the process chamber 16a. Each of the substrate mounting tables 44a and 44b is supported by providing a plurality of support columns 49 configured to support the substrate mounting tables 44a and 44b from thereunder. Hereinafter, the plurality of support columns 49 may also be simply referred to as support columns 49.

The substrate mounting tables 44a and 44b are constituted by a structure made of a material whose main constituent is aluminum. By using the structure made of the material whose main constituent is aluminum in a vacuum vessel (not shown) of the substrate processing apparatus 10, it is possible to achieve advantages such as a high thermal conductivity, easy processing, an excellent corrosion resistance and a low cost. In particular, by using the structure made of the material whose thermal conductivity is high, it is possible to efficiently and uniformly transfer the heat from heaters 45a and 45b serving as a first heating structure described later to the substrate 22. Therefore, when performing a substrate processing, it is possible to heat the substrate 22 such that a temperature of the substrate 22 becomes uniform on a surface of the substrate 22, and it is also possible to improve a uniformity of the substrate processing on the surface of the substrate 22. However, since the strength of a structure made of pure aluminum decreases when heated, such structure may be easily deformed when heated. Thus, it is difficult to practically use the structure made of pure aluminum in a high temperature range higher than 400° C.

Therefore, according to the present embodiments, in order to increase a mechanical strength in a high temperature range, the substrate mounting tables 44a and 44b are made of an aluminum alloy to which a small amount of an element such as magnesium (Mg) and chromium (Cr) is added. For example, a material such as A5052 and A5056 may be used as the aluminum alloy. According to the present embodiments, particularly, the A5052 may be used. The A5052 is an aluminum alloy containing magnesium (from 2.2% to 2.8%), chromium (from 0.15% to 0.35%), silicon, iron, copper, manganese, zinc and other elements. By using the A5052, it is possible to suppress a thermal deformation due to a decrease in the strength even in the high temperature range higher than 400° C. In the present specification, a notation of a numerical range such as "from 2.2% to 2.8%" means that a lower limit and an upper limit are included in the numerical range. Therefore, for example, a numerical range "from 2.2% to 2.8%" means a range equal to or higher than 2.2% and equal to or lower than 2.8%. The same also applies to other numerical ranges described herein.

However, on the other hand, when a structure made of the aluminum alloy such as the A5052 (also referred to as an "aluminum alloy structure") is heated in the process vessel 47, magnesium contained in the aluminum alloy may be vaporized and scattered in the process vessel 47. As a result, an inner portion of the process vessel 47 and the substrate 22 to be processed may be contaminated. This is because a vapor pressure of magnesium is relatively high, which makes magnesium easily vaporized and scattered from an inside of the aluminum alloy at a high temperature. Further, as an inner pressure of the process vessel 47 becomes lower, magnesium is more remarkably vaporized and scattered. When the inner portion of the process vessel 47 or the substrate 22 to be processed is contaminated with magnesium, the substrate processing apparatus 10 cannot perform a normal processing, or the substrate 22 to be processed may be subject to lot rejection. Therefore, according to the present embodiments, as will be described later, a film forming process is performed in advance on the substrate mounting tables 44a and 44b made of the aluminum alloy so as to prevent magnesium from being vaporized and precipitated.

When the substrate mounting tables 44a and 44b are made of stainless steel (SUS), it is possible to improve a heat resistance as compared with a case where the substrate mounting tables 44a and 44b are made of the aluminum alloy. However, the thermal conductivity is lowered. Further, when the substrate mounting tables 44a and 44b are made of aluminum nitride (AlN), the thermal conductivity may be higher than that of the case where the substrate mounting tables 44a and 44b are made of the aluminum alloy. However, the heat resistance is lowered. Therefore, according to the present embodiments, the substrate mounting tables 44a and 44b are made of the aluminum alloy. The present embodiments will be described by way of an example in which the substrate mounting tables 44a and 44b except for portions in which the heaters 45a and 45b are embedded are entirely made of the A5052. However, for example, a structure constituting an inner portion of each of the substrate mounting tables 44a and 44b may be made of stainless steel (SUS) and a periphery including the surface of each of the substrate mounting tables 44a and 44b may be covered with the aluminum alloy. With such a configuration, it is possible to further improve the heat resistance of each of the substrate mounting tables 44a and 44b.

The heaters 45a and 45b serving as the first heating structure are embedded in the substrate mounting tables 44a and 44b below the substrate placing surfaces 41a and 41b, respectively. The heaters 45a and 45b are configured to heat the substrate 22. When an electric power is supplied to the heaters 45a and 45b, the surface of the substrate 22 is heated to a predetermined temperature. Temperature sensors (not shown) are provided at the substrate mounting tables 44a and 44b, respectively. A controller 121 corresponding to a controller 77 shown in FIG. 3 is electrically connected to the heaters 45a and 45b and the temperature sensors. The controller 121 is configured to control the electric power supplied to the heaters 45a and 45b based on temperature information detected by the temperature sensors.

A plurality of substrate support pins (for example, three substrate support pins: not shown) are provided at an outer periphery of each of the substrate placing surface (also referred to as a "first substrate placing surface") 41a of the substrate mounting table 44a and the substrate placing surface (also referred to as a "second substrate placing surface") 41b of the substrate mounting table 44b so as to vertically pass through the substrate mounting tables 44a and 44b, respectively. Hereinafter, the plurality of substrate support pins may also be simply referred to as substrate support pins. The support pins are configured to be elevated and lowered in the vertical direction. Thereby, by elevating and lowering the support pins after the substrates 22 transferred from the transfer chamber 12 into the process chamber 16a through a component such as the vacuum robot 36 are placed on the support pins, the substrates 22 are placed on the first substrate mounting table 44a (that is, the first substrate placing surface 41a) and the second substrate mounting table 44b (that is, the second substrate placing surface 41b), respectively.

Support Structure

As shown in FIG. 4, a support structure 55 configured to support the substrate mounting tables 44a and 44b is provided between the support columns 49 and the substrate mounting tables 44a and 44b. That is, the support structure 55 is provided at a bottom surface of each of flanges 53a and 53b of the substrate mounting tables 44a and 44b. The support columns 49 are inserted into the support structure 55 through, for example, an opening portion 55a in the support structure 55.

Exhaust baffle rings 54a and 54b are provided to surround outer circumferences of the substrate mounting tables 44a and 44b, respectively. Each of the exhaust baffle rings 54a and 54b is provided with an exhaust hole.

Lamp houses 67a and 67b serving as a second heating structure are provided on a ceiling of the process vessel 47. The lamp houses 67a and 67b are configured to heat the substrate 22 from substantially opposite to the heaters 45a and 45b as the first heating structure. The lamp houses 67a and 67b are provided with lamp groups 57a and 57b serving as heating sources, respectively.

Substrate Transfer Device

A robot arm 64 serving as a substrate transfer device is provided between the first processing structure 59 and the second processing structure 61 in the process chamber 16a, that is, at the partition structure 46. The robot arm 64 is configured to transfer the substrate 22 in the process chamber 16a and to stand by in the process chamber 16a while the substrate processing is being performed.

Gas Supplier

As shown in FIG. 3, a gas supplier (which is a gas supply structure or a gas supply system) configured to supply a process gas into the process chamber 16a is provided at an upper portion of the process chamber 16a. That is, as the gas supplier, a first gas supplier 51a configured to supply the process gas to the first processing structure 59 and a second gas supplier 51b configured to supply the process gas to the second processing structure 61 are provided. The lid 43 constituting the process vessel 47 is provided with gas supply ports 63a and 63b. Downstream ends of a first gas supply pipe 65a and a second gas supply pipe 65b are airtightly connected to the gas supply ports 63a and 63b of the lid 43, respectively.

Nitrogen gas supply sources (not shown) configured to supply $N_2$ gas (which is a nitrogen-containing gas serving as the process gas), mass flow controllers (MFCs) (not shown) serving as flow rate controllers and valves (not shown) serving as opening/closing valves are sequentially provided at the first and second gas supply pipes 65a and 65b, respectively, from upstream sides to downstream sides of the first and second gas supply pipes 65a and 65b.

The controller 77 described later is electrically connected to the MFCs and the valves. The controller 77 is configured to control a flow rate adjusting operation of each MFC and an opening and closing operation of each valve such that a flow rate of a gas such as the process gas supplied into the process chamber 16a reaches and is maintained at a predetermined flow rate. Thereby, it is possible to appropriately supply the $N_2$ gas serving as the process gas into the process chamber 16a through the first and second gas supply pipes 65a and 65b and the gas supply ports 63a and 63b while controlling a flow rate of the $N_2$ gas by the MFCs. The nitrogen gas supply sources, the MFCs and the valves may be independently provided at the first and second gas suppliers 51a and 51b, or may be shared between the first and second gas suppliers 51a and 51b.

The gas supplier (that is, the first gas supplier 51a and the second gas supplier 51b) according to the present embodiments is constituted mainly by the first and second gas supply pipes 65a and 65b, the nitrogen gas supply sources, the MFCs and the valves.

Exhauster

First exhaust ports 58 are provided below the exhaust baffle rings 54a and 54b, respectively. The first exhaust ports 58 are formed by the process vessel 47 (that is, the lower vessel 48) and the substrate mounting tables 44a and 44b. Middle plates are provided below the substrate mounting tables 44a and 44b of the process vessel 47 (lower vessel 48), respectively. Second exhaust ports 60 through which the gas such as the process gas is exhausted from the process chamber 16a are provided at the middle plates, respectively. In addition, third exhaust ports 62 through which the gas such as the process gas exhausted through the second exhaust ports 60 is exhausted are provided at a bottom surface of the lower vessel 48. An upstream end of a gas exhaust pipe (not shown) through which the gas is exhausted is connected to the third exhaust ports 62. An APC (Automatic Pressure Controller) valve (not shown) serving as a pressure regulator, a valve (also referred to as an "exhaust valve") (not shown) serving as an opening/closing valve, and a pump (also referred to as a "vacuum pump") (not shown) serving as an exhaust apparatus are provided at the gas exhaust pipe. Further, the gas exhaust pipe is provided with a pressure sensor (not shown).

The controller 121 to be described later is electrically connected to the APC valve, the exhaust valve, the vacuum pump and the pressure sensor. The controller 121 is configured such that an inner atmosphere of the process chamber 16a can be exhausted by operating the vacuum pump and opening the exhaust valve. That is, the process gas supplied through the first and second gas suppliers 51a and 51b is exhausted out of the process chamber 16a through the exhaust holes of the exhaust baffle rings 54a and 54b, the first exhaust ports 58, the second exhaust ports 60 and the third exhaust ports 62.

In addition, the controller 121 is configured such that an inner pressure of the process chamber 16a is lowered to, for example, about 0.1 Pa by adjusting an opening degree of the APC valve based on pressure information detected by the pressure sensor.

An exhauster (which is an exhausting structure or an exhaust system) according to the present embodiments is constituted mainly by the first exhaust ports 58, the second exhaust ports 60, the third exhaust ports 62, the gas exhaust pipe, the APC valve, the exhaust valve and the vacuum pump.

Controller

Figure 5:
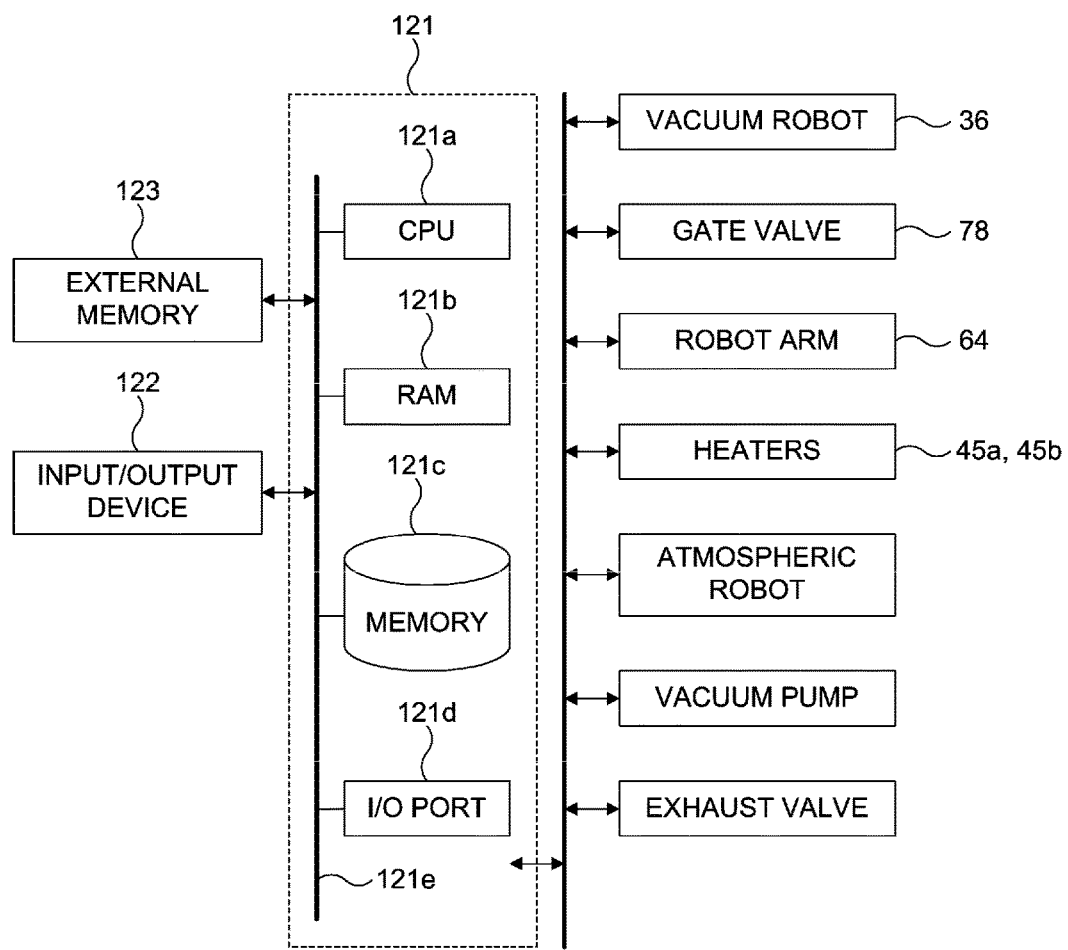
FIG. 5 is a block diagram schematically illustrating a configuration of a controller and related components of the substrate processing apparatus according to the embodiments described herein.

As shown in FIG. 5, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control the operation of the substrate processing apparatus 10 or a process recipe containing information on the sequences and conditions of the substrate processing described later may be readably stored in the memory 121c. The process recipe is obtained by combining steps of the substrate processing described later such that the controller 121 can execute the steps to acquire a predetermined result, and functions as a program. Hereafter, the process recipe and the control program may be collectively or individually referred to as a "program". In addition, the process recipe may also be simply referred to as a "recipe". In the present specification, the term "program" may indicate the recipe alone, may indicate the control program alone, or may indicate both of the recipe and the control program. The RAM 121b functions as a memory area (work area) where a program or data read by the CPU 121a is temporarily stored.

The I/O port 121d is connected to components of the substrate processing apparatus 10 such as the vacuum robot 36, the gate valve 78, the robot arm 64 and the heaters 45a and 45b.

The CPU 121a is configured to read the control program from the memory 121c and execute the read control program. In addition, the CPU 121a is configured to read the recipe from the memory 121c in accordance with an operation command inputted from the input/output device 122. According to the contents of the read recipe, the CPU 121a may be configured to control various operations such as a substrate transfer operation by the vacuum robot 36, an opening and closing operation of the gate valve 78, a temperature adjusting operation of the heaters 45a and 45b, a start and stop of the vacuum pump, and a substrate transfer operation by the atmospheric robot.

(3) Film-Forming Process of Aluminum Alloy Structure (Process of Preventing Volatilization and Precipitation of Magnesium)

Subsequently, an example of a thermal oxidation process (which is a film-forming process of forming a coating film (layer)) on a surface of the aluminum alloy containing magnesium with respect to the substrate mounting table 44a of the substrate processing apparatus 10 (that is, a process of heating the surface of the aluminum alloy to a predetermined first temperature under an atmospheric atmosphere (i.e. an air atmosphere) and a process of forming the coating film (for example, an oxide coating film) of the aluminum oxide on the surface of the substrate mounting table 44a by maintaining a temperature of the surface of the aluminum alloy at the first temperature for a predetermined time) will be described.

According to the present embodiments, before installing the substrate mounting table 44a provided with the heater 45a on the process vessel 47 of the substrate processing apparatus 10, the following film-forming process is performed on the substrate mounting table 44a while the substrate mounting table 44a is located outside the process vessel 47. The film-forming process may be performed in a vessel other than a closed vessel. However, it is preferable to perform the film-forming process in a heat process chamber (heat process vessel) capable of maintaining the following process atmosphere. According to the present embodiments, the film-forming process is performed in the heat process chamber different from the process vessel 47 of the substrate processing apparatus 10. The heat process chamber is configured such that an inner atmosphere of the heat process chamber can be maintained at a predetermined humidity. By performing the film-forming process on the substrate mounting table 44a while the substrate mounting table 44a is located outside the process vessel 47 in which the substrate 22 is processed, it is possible to prevent magnesium from being vaporized from the aluminum alloy and being attached to the inner portion of the process vessel 47. Thereby, it is possible to prevent the inner portion of the process vessel 47 from being contaminated.

First, the substrate mounting table 44a is loaded into the heat process chamber, and the inner atmosphere of the heat process chamber is adjusted such that an absolute humidity thereof reaches and is maintained to a humidity ranging from 11.0 (g/m$^3$) to 12.5 (g/m$^3$) under the atmospheric atmosphere. Thereafter, the electric power is applied to the heater 45a embedded in the substrate mounting table 44a so as to heat the substrate mounting table 44a such that a temperature of the surface of the substrate mounting table 44a reaches and is maintained at the first temperature (for example, 450° C.). For example, the heater 45a heats the substrate mounting table 44a such that the temperature of the surface of the substrate mounting table 44a is maintained at the first temperature for 3 hours. As a result, the oxide coating film made of the aluminum oxide is formed on the surface of the substrate mounting table 44a made of the aluminum alloy.

According to the present embodiments, the oxide coating film is formed on the entirety of the surface of the substrate mounting table 44a. That is, the oxide coating film is formed on the surface of the substrate mounting table 44a including the flange 53a, which is indicated by a thick line in FIG. 4. However, the oxide coating film may be formed on at least a part of the surface of the substrate mounting table 44a such as a portion exposed to the process chamber 16a when the substrate mounting table 44a is installed in the process vessel 47. By forming the oxide coating film on at least the entirety of the portion exposed to the process chamber 16a, it is possible to prevent magnesium precipitated from the aluminum alloy from being released into the process chamber 16a. Thereby, it is possible to prevent the process chamber 16a from being contaminated.

Further, while the present embodiments are described by way of an example in which the temperature of the surface of the substrate mounting table 44a is elevated by applying the electric power to the heater 45a embedded in the substrate mounting table 44a, the present embodiments are not limited thereto. For example, instead of the heater 45a or in parallel with the heater 45a, the surface of the substrate mounting table 44a may be heated by radiating the heat from a heater (not shown) provided outside the substrate mounting table 44a (that is, from the heater provided to face the surface of the substrate mounting table 44a).

(4) Evaluation of Effect of Film-Forming Process on Aluminum Alloy Samples

Figure 6:
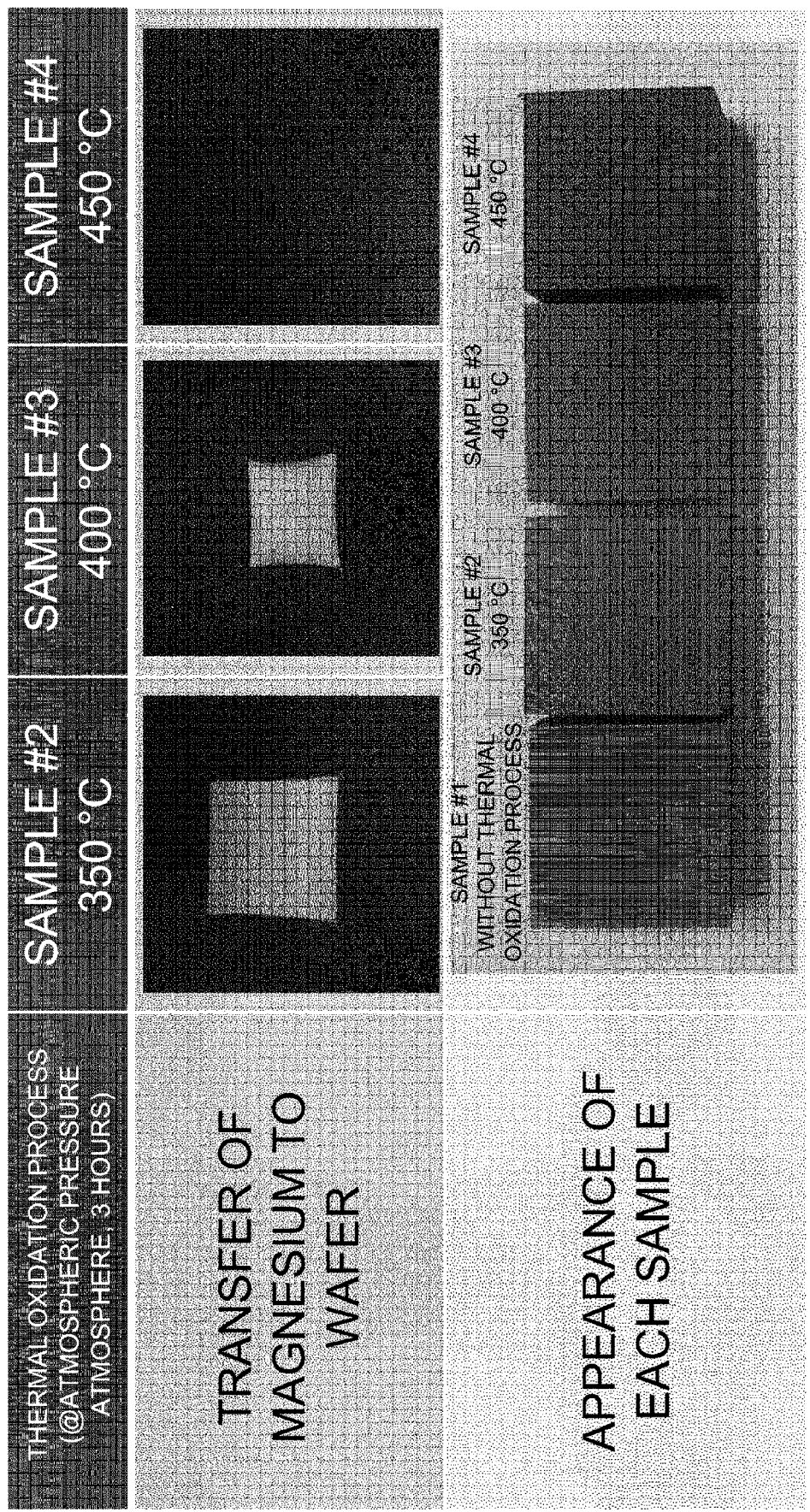
FIG. 6 is a diagram for explaining an example of experimental results in case of using the substrate processing apparatus according to the embodiments described herein.

Subsequently, experimental results are described. FIG. 6 is a diagram schematically illustrating the experimental results in which an effect of the film-forming process according to the present embodiments is verified using samples. In experiments for verifying the effect of the film-forming process, a sample #1, a sample #2, a sample #3 and a sample #4 are prepared using blocks of the A5052 (which is the aluminum alloy), and a difference in an efficiency of preventing the volatilization and precipitation of magnesium due to a difference in a thermal oxidation temperature (that is, the first temperature) is evaluated. The sample #1 is prepared without performing the film-forming process of forming the coating film, and the samples #2 through #4 are prepared by performing the film-forming process. In the film-forming process for the samples #2 through #4, the blocks of the A5052 are placed on a heater under an atmospheric pressure atmosphere in which the absolute humidity is adjusted to a humidity ranging from 11.0 (g/m$^3$) to 12.5 (g/m$^3$), and temperatures of surfaces of the blocks of the A5052 are maintained at predetermined temperatures for 3 hours, respectively. A surface temperature (that is, an oxidation process temperature serving as the first temperature) of the sample #2 is set to 350° C., that of the sample #3 is set to 400° C., and that of the sample #4 is set to 450° C.

The appearance of the sample #1 without performing the film-forming process and the appearance of each of the samples #2 through #4 with performing the film-forming process are schematically illustrated in a lower portion of FIG. 6. From the appearance of the sample #1 without performing the film-forming process and the appearance of the sample #2 on which the film-forming process whose oxidation process temperature is 350° C. is performed, it is confirmed that no oxide coating film is formed on the sample #1 or the sample #2. Further, from the appearance of the sample #3 on which the film-forming process whose oxidation process temperature is 400° C. is performed, it is confirmed that the oxide coating film is formed on the sample #3. However, from the appearance of the sample #3 and the appearance of the sample #4 whose oxidation process temperature is 450° C., it is estimated that the oxide coating film formed on the sample #3 is thinner than the oxide coating film formed on the sample #4. As a result of measuring a thickness of the oxide coating film formed on the surface of the sample #4, the thickness of the oxide coating film on the sample #4 is about 1.0 µm.

From the results shown in the lower portion of FIG. 6, it is confirmed that, in order to form the oxide coating film on the surface of the aluminum alloy such as the A5052, it is preferable to elevate the temperature of the surface of the aluminum alloy to 400° C. or higher. It is also confirmed that, in order to form the oxide coating film of 1.0 µm or more on the surface of the aluminum alloy, it is preferable to elevate the temperature of the surface of the aluminum alloy to 450° C. or higher.

A state of transferring magnesium to a silicon substrate for each of the samples #2 through #4 is schematically illustrated in a middle portion of FIG. 6. The state of transferring magnesium to the silicon substrate for each of the samples #2 through #4 is obtained by reproducing the same conditions as when the substrate mounting table 44a is placed in the substrate processing apparatus 10 and the substrate 22 is processed using the substrate processing apparatus 10 and by placing the samples #2 through #4 after the film-forming process under the conditions described above. As sampling conditions for each of the samples #2 through #4, the samples #2 through #4 are heated after the film-forming process until the temperature of the surface of each sample reaches and is maintained at 450° C., and the silicon substrate is placed on each heated sample for 24 hours under conditions that an atmosphere around each sample is 100% N$_2$ gas and a pressure around each sample is 6 Torr. Based on the state of transferring magnesium from each sample to the silicon substrate, it is possible to determine whether or not magnesium is vaporized and/or precipitated from each sample under the same conditions as when the substrate processing is performed.

As shown in the middle portion of FIG. 6, in the sample #2 and the sample #3, magnesium is transferred to the silicon substrate, as indicated in white in FIG. 6. Therefore, in the sample #3 whose oxidation process temperature is 400° C., it is confirmed that, although the oxide coating film is formed, the effect of suppressing the precipitation of magnesium is insufficient. On the other hand, in the sample #4, magnesium is not transferred to the silicon substrate. Therefore, in the sample #4 whose oxidation process temperature is 450° C., it is confirmed that the effect of suppressing the precipitation of magnesium can be clearly obtained by the oxide coating film formed on the surface of the aluminum alloy.

From the results described above, it is estimated that a threshold temperature at or above which the effect of suppressing the precipitation of magnesium can be obtained exists within a range from 400° C. to 450° C. of the oxidation process temperature. Further, it is confirmed that the effect of suppressing the precipitation of magnesium can be clearly obtained by setting the oxidation process temperature to 450° C. or higher and the thickness of the oxide coating film formed on the surface of the aluminum alloy to 1.0 μm or higher.

That is, according to the experimental results described above, it is clarified that the oxide coating film (that is, the aluminum oxide film) of a predetermined thickness of 1.0 μm or more (which is sufficient to obtain the effect of suppressing the precipitation of magnesium) can be formed on the surface of the aluminum alloy structure as in the film-forming process on the sample #4 by performing: (a) heating the surface of the aluminum alloy structure to the predetermined first temperature of 450° C. or higher under the atmospheric atmosphere (atmospheric pressure atmosphere) in which the absolute humidity is adjusted to a humidity ranging from 11.0 (g/m$^3$) to 12.5 (g/m$^3$); and (b) maintaining the temperature of the surface of the aluminum alloy structure at the first temperature for a predetermined time of at least 2 hours, preferably 3 hours or more. Further, it is verified that magnesium in the oxide coating film is sufficiently oxidized so as to form a film substantially free of magnesium.

Therefore, by performing the film-forming process of forming the oxide coating film to the substrate mounting table 44a made of the same aluminum alloy under the same conditions (thermal oxidation conditions), it is possible to obtain the same effect of suppressing the precipitation of magnesium on the substrate mounting table 44a. The oxide coating film is formed on at least the entire exposed portion of the surface of the substrate mounting table 44a exposed to the process chamber 16a. Thereby, it is possible to prevent magnesium precipitated from the aluminum alloy from being released into the process chamber 16a. As a result, it is possible to prevent the process chamber 16a from being contaminated. In addition, as described above, when the film-forming process of forming the coating film is performed on the entirety of the substrate mounting table 44a, the oxide coating film is also formed on a surface of the flange 53a.

In the film-forming process according to the present embodiments, magnesium contained in the vicinity of the surface of the aluminum alloy structure is volatilized or oxidized to form the coating film of aluminum oxide containing oxidized magnesium (MgO) and substantially free of magnesium. Thereby, it possible to prevent magnesium from being vaporized or being volatilized from the coating film. When a process time of the film-forming process or the oxidation process temperature is insufficient, magnesium may remain in the oxide coating film without being oxidized, or the thickness of the oxide coating film may be insufficient to prevent the precipitation of magnesium. In such a case, the effect of preventing the precipitation of magnesium cannot be obtained.

(5) Substrate Processing

Hereinafter, as a part of manufacturing processes of a semiconductor device, an example of a step (which is the substrate processing) of performing a nitriding process on the substrate 22 such as a wafer will be described. The substrate processing is performed using the process chamber 16a of the substrate processing apparatus 10 described above. According to the present embodiments, the substrate processing is performed using the substrate mounting tables 44a and 44b on which the same film-forming process of forming the oxide coating film as in the sample #4 described above is performed in advance. In the following description, the operations of the components constituting the substrate processing apparatus 10 are controlled by the controller 121.

Substrate Loading Step

First, the gate valve 78 is opened, and the vacuum robot 36 is moved into the process chamber 16a while simultaneously transferring the two substrates among the substrates 22 placed on the finger pair 40. As a result, each of the two substrates among the substrates 22 is transferred (loaded) into the process chamber 16a through the transfer chamber 12 via the gate valve 78.

Substrate Placing Step

Then, the two substrates among the substrates 22 loaded into the process chamber 16a are transferred to and placed on the first substrate placing surface 41a and the second substrate placing surface 41b, respectively, by the substrate support pins (not shown) and the robot arm 64 provided at the substrate mounting tables 44a and 44b.

Temperature Elevating and Pressure Adjusting Step

Subsequently, the electric power is supplied to the heaters 45a and 45b embedded in the substrate mounting tables 44a and 44b, respectively, so as to heat the two substrates among the substrates 22 such that the temperature of the surface of each of the two substrates placed on the substrate placing surfaces 41a and 41b of the substrate mounting tables 44a and 44b reaches and is maintained at a desired pressure (for example, 425° C.), respectively. For convenience, the temperature of the surface of each of the substrate mounting tables 44a and 44b in the temperature elevating and pressure adjusting step may also be simply referred to as a "surface temperature" (or a second temperature) of the substrate processing. In the temperature elevating and pressure adjusting step, the temperature of each of the heaters 45a and 45b is adjusted by controlling the electric power supplied to each of the heaters 45a and 45b based on the temperature information detected by the temperature sensors (not shown). According to the present embodiments, the lamp houses 67a and 67b are not used to heat the substrates 22. However, it is possible to further elevate the temperature of the surface of the substrate 22 by using the lamp houses 67a and 67b in addition to the heaters 45a and 45b.

In the temperature elevating and pressure adjusting step, the inner atmosphere of the process chamber 16a is vacuum-exhausted by the vacuum pump (not shown) such that the inner pressure of the process chamber 16a reaches and is maintained at a desired pressure (for example, 6 Torr according to the present embodiments). In the temperature elevating and pressure adjusting step, the inner pressure of the process chamber 16a is measured by the pressure sensor (not shown), and the opening degree of the APC valve (not shown) is feedback-controlled based on the pressure information detected by the pressure sensor.

Substrate Processing Step

In parallel with heating the substrate 22, the $N_2$ gas serving as the process gas is supplied into the process chamber 16a. Specifically, the valves (not shown) of the first and second gas suppliers 51a and 51b are opened to supply the process gas to the first processing structure 59 and the second processing structure 61 through the first and second gas supply pipes 65a and 65b, respectively. While the present embodiments are described by way of an example in which the $N_2$ gas is used as the process gas, the present embodiments are not limited thereto. For example, an oxygen-containing gas may be used as the process gas when an ashing process is performed on the substrate 22, and a gas such as an inert gas may be used as the process gas when the heat treatment process is performed on the substrate 22. By heating the substrate 22 in the atmosphere of the process gas supplied to the substrate 22, a predetermined processing is performed.

After a predetermined time has elapsed and a desired processing is completed, the valves of the first and second gas suppliers 51a and 51b are closed to stop the supply of the $N_2$ gas into the process chamber 16a.

Returning to Atmospheric Pressure and Substrate Unloading Step

When the predetermined processing is completed, the supply of the electric power to each of the heaters 45a and 45b is stopped to lower the inner temperature of the process chamber 16a, and the opening degree of the APC valve (not shown) of the exhauster is adjusted to return the inner pressure of the process chamber 16a to the atmospheric pressure. Then, the two processed substrates among the substrates 22 are transferred (unloaded) out of the process chamber 16a to the transfer chamber 12 in the order reverse to that of the substrate loading step and the substrate placing step S102 described above. That is, the two processed substrates are unloaded out of the process chamber 16a by the robot arm 64 and the finger pair 40 of the vacuum robot 36 by performing a predetermined operation in the order reverse to that of loading the two substrates among the substrates 22. Then, the substrate processing according to the present embodiments is completed.

By using the substrate mounting tables 44a and 44b on which the same film-forming process as the sample #4 is performed as described above, even when the inner pressure of the process chamber 16a is 6 Torr and the temperature of the surface of each of the substrate mounting tables 44a and 44b is heated to 425° C., it is possible to suppress the volatilization and precipitation of magnesium from the aluminum alloy constituting the substrate mounting tables 44a and 44b.

That is, according to the present embodiments described above, the oxide coating film capable of preventing the volatilization and precipitation of magnesium contained in the surface of the substrate support made of the aluminum alloy is formed on the substrate support wherein at least its surface is made of the aluminum alloy containing magnesium. Thereby, even when the substrate processing is performed under conditions in which the surface temperature (second temperature) during the substrate processing is high, in particular, the surface temperature is a temperature at which the thermal deformation of the pure aluminum occurs (for example, a temperature higher than 400° C. which is an actual durable temperature of the pure aluminum), it is possible to obtain the substrate support free from problems such as the precipitation of magnesium and the thermal deformation. However, when the surface temperature during the substrate processing is higher than 600° C., the aluminum alloy may soften or melt. Therefore, it is preferable that the surface temperature during the substrate processing is set to be 600° C. or lower at which such a phenomenon is unlikely to occur.

Further, when magnesium from the aluminum alloy constituting the substrate support is vaporized and scattered in the process vessel of the substrate processing apparatus and is attached to the inner portion of the process vessel or the substrate in the process vessel, the substrate processing apparatus cannot perform the normal processing or the substrate may be subject to the lot rejection. However, according to the present embodiment described above, it is possible to prevent the problems described above by forming the oxide coating film on the surface of the substrate support.

In the present embodiments, a preferable oxidation process temperature (first temperature) for the structure made of the aluminum alloy (that is, the aluminum alloy structure) is 450° C. or higher. As shown in the experimental results described above, by performing the film-forming process at at least 450° C., it is possible to form the oxide coating film sufficient to obtain the effect of suppressing the precipitation of magnesium. That is, it is possible to form the oxide coating film whose thickness is sufficient to suppress the precipitation of magnesium contained in the aluminum alloy covered with the oxide coating film and substantially free of magnesium by sufficiently oxidizing magnesium in the oxide coating film. When the oxidation process temperature is less than 450° C., the thickness of the oxide coating film may be insufficient to suppress the precipitation of magnesium or the oxidation of magnesium in the oxide coating film may be insufficient. Therefore, the effect of preventing the precipitation of magnesium may not be obtained. In particular, when the oxidation process temperature is 400° C. or less, as shown in the experimental results described above, the precipitation of magnesium may tend to occur. However, when the oxidation process temperature is higher than 600° C., the aluminum alloy may soften or melt. Therefore, it is preferable that the oxidation process temperature during the substrate processing is set to be 600° C. or less at which such a phenomenon is unlikely to occur.

Further, it is preferable that the oxidation process temperature (first temperature) is equal to or higher than the surface temperature (second temperature) during the substrate processing. By performing the film-forming process of forming the coating film under a temperature condition equal to or higher than the temperature of the surface of the aluminum alloy during the heat treatment process of the substrate 22 (that is, the substrate processing), it is possible to further suppress the precipitation of magnesium from the aluminum alloy during the substrate processing.

Further, as shown in the experimental results described above, by setting the thickness of the oxide coating film formed on the surface of the aluminum alloy structure to 1 μm or more, it is possible to prevent (or suppress) magnesium contained in the aluminum alloy from permeating through the oxide coating film and being released into the process chamber 16a even when the surface temperature (second temperature) during the substrate processing is elevated to 450° C. When the thickness of the oxide coating film is less than 1 μm and the surface temperature (second temperature) during the substrate processing is elevated to 450° C., magnesium contained in the aluminum alloy may permeate through the oxide coating film and may be released into the process chamber 16a. Further, preferably, the thickness of the oxide coating film may be set to 3 µm or more. Thereby, even when the surface temperature (second temperature) is elevated to 450° C., it is possible to further prevent (or suppress) magnesium contained in the aluminum alloy from permeating through the oxide coating film and being released into the process chamber 16a. When the thickness of the oxide coating film is greater than 10 the oxide coating film may substantially affect the heat conduction on the surface of the substrate support. Therefore, it is preferable that the thickness of the oxide coating film is 10 µm or less.

It is also preferable that the atmospheric atmosphere in which the film-forming process of forming the oxide coating film is performed contains water vapor. By performing the film-forming process of forming the oxide coating film in the atmosphere containing the water vapor, it is possible to increase a film-forming rate of forming the oxide coating film. Further, by performing the film-forming process of forming the oxide coating film under the atmospheric pressure, it is possible to form the oxide coating film capable of suppressing the precipitation of magnesium relatively easily even with simple equipment. However, the pressure in the film-forming process of forming the oxide coating film is not limited to the atmospheric pressure. For example, the film-forming process of forming the oxide coating film may be performed under a slight depressurization (for example, 600 Torr or more and less than 760 Torr) or a slight pressurization (for example, more than 760 Torr and 900 Torr or less).

In the film-forming process of forming the oxide coating film, it is preferable that the time of maintaining the temperature of the surface of the aluminum alloy structure at the first temperature is 3 hours or more. By performing the thermal oxidation process serving as the film-forming process for at least 3 hours or more, it is possible to form the oxide coating film whose thickness is sufficient to suppress the precipitation of magnesium contained in the aluminum alloy and substantially free of magnesium due to a sufficient oxidization of magnesium in the oxide coating film. When the time of maintaining the temperature of the surface of the aluminum alloy structure at the first temperature is less than 3 hours, it is difficult to form the oxide coating film whose thickness (for example, 1 µm or more) is sufficient to suppress the precipitation of magnesium contained in the aluminum alloy. In addition, it is possible to form the oxide coating film whose thickness is sufficient to suppress the precipitation of magnesium when the time of maintaining the surface of the aluminum alloy structure at the first temperature is 100 hours or less. Therefore, it is preferable that the time of maintaining the surface of the aluminum alloy structure at the first temperature is 100 hours or less in consideration of the productivity.

It is preferable for a composition of the aluminum alloy to contain a magnesium content of 2 wt % to 5 wt % (for example, 2.2 wt % or more), which enables to suppress the precipitation of magnesium by forming the oxide coating film. By performing the film-forming process of forming the oxide coating film according to the present embodiments, even in a case where the magnesium content of the aluminum alloy is 2 wt % or more, it is possible to expect the effect of suppressing the precipitation of magnesium to an extent substantially free from the contamination by magnesium. However, when the magnesium content is higher than 5 wt %, it is difficult to suppress the precipitation of magnesium to the extent substantially free from the contamination by magnesium within a practical thickness range of the oxide coating film. Therefore, it is preferable that the magnesium content t is 5 wt % or less.

Other Embodiments

While the technique of the present disclosure is described in detail by way of the embodiments described above, the above-described technique is not limited thereto. The above-described technique may be modified in various ways without departing from the scope thereof. For example, the above-described embodiments are described in detail for a better understanding of the technique of the present disclosure. That is, the above-described technique is not limited to a configuration including the entirety of the components of the above-described embodiments.

As described above, according to some embodiments in the present disclosure, it is possible to prevent the constituent contained in the aluminum alloy from being vaporized and scattered when the aluminum alloy is used in the process vessel which is heated to a high temperature.

What is claimed is:

1. A substrate processing apparatus comprising:
   a process chamber in which a substrate is processed;
   a substrate support configured to support the substrate in the process chamber;
   a heater configured to heat the substrate supported by the substrate support; and
   a heat processing chamber different from the process chamber,
   wherein the substrate support is made of an aluminum alloy,
   a surface of the substrate support is coated by a coating film of aluminum oxide by heating the surface of the substrate support in the heat processing chamber to a predetermined first temperature under an atmospheric atmosphere before the substrate is processed in the process chamber while being held by the substrate support and maintaining a temperature of the surface of the substrate support at the predetermined first temperature for a predetermined time under the atmospheric atmosphere in the heat processing chamber.

2. The substrate processing apparatus of claim 1, further comprising:
   a controller configured to control the heater so as to heat the surface of the substrate support and the substrate such that the temperature of the surface of the substrate support reaches a predetermined second temperature while the substrate is being supported by the substrate support.

3. The substrate processing apparatus of claim 2, wherein the predetermined first temperature is equal to or higher than the predetermined second temperature.

4. The substrate processing apparatus of claim 2, wherein the predetermined second temperature is higher than 400° C.

5. The substrate processing apparatus of claim 1, wherein the predetermined first temperature is 450° C. or higher.

6. The substrate processing apparatus of claim 1, wherein the atmospheric atmosphere contains water vapor.

7. The substrate processing apparatus of claim 1, wherein (b) is performed under an atmospheric pressure.

8. The substrate processing apparatus of claim 1, wherein a thickness of the coating film of aluminum oxide is 1 µm or more.

9. The substrate processing apparatus of claim 1, wherein the coating film of aluminum oxide is provided on at least an entire exposed portion of the surface of the substrate support exposed to the process chamber.

10. The substrate processing apparatus of claim 1, wherein a magnesium content in the aluminum alloy is 2 wt % or more.

11. A method of manufacturing a semiconductor device, comprising:
- (A) placing a substrate on a substrate support made of an aluminum alloy containing magnesium, wherein a surface of the substrate support contains magnesium oxide and is coated by a coating film of aluminum oxide, and the coating film of aluminum oxide is formed on the surface of the substrate support by performing:
  - (a) before the substrate is processed in a process chamber while being held by the substrate support, heating the surface of the substrate support in a heat processing chamber, which is different from the process chamber, to a predetermined first temperature under an atmospheric atmosphere; and
  - (b) maintaining a temperature of the surface of the substrate support at the predetermined first temperature for a predetermined time under the atmospheric atmosphere in the heat processing chamber; and
- (B) heating the surface of the substrate support and the substrate such that the temperature of the surface of the substrate support reaches a predetermined second temperature while the substrate is being supported by the substrate support.

12. A method of processing a substrate support made of an aluminum alloy containing magnesium, the method comprising:
- (a) before a substrate is processed in a process chamber while being held by the substrate support, heating a surface of the substrate support in a heat processing chamber, which is different from the process chamber, to a predetermined first temperature under an atmospheric atmosphere; and
- (b) forming a coating film of aluminum oxide on the surface of the substrate support by maintaining a temperature of the surface of the substrate support at the predetermined first temperature for a predetermined time under the atmospheric atmosphere in the heat processing chamber.

13. The method of claim 12, wherein the predetermined first temperature is 450° C. or higher.

14. The method of claim 12, wherein a thickness of the coating film of aluminum oxide is 1 µm or more.

15. The method of claim 12, wherein (b) is performed under an atmospheric pressure.

16. The method of claim 12, wherein the coating film of aluminum oxide is provided on at least an entire exposed portion of the surface of the substrate support exposed to the process chamber in which the substrate is processed on the substrate support.

17. The method of claim 12, wherein a magnesium content in the aluminum alloy is 2 wt % or more.

* * * * *